US008513761B2

(12) United States Patent
Roy et al.

(10) Patent No.: US 8,513,761 B2
(45) Date of Patent: Aug. 20, 2013

(54) BACKSIDE ILLUMINATION SEMICONDUCTOR IMAGE SENSOR

(75) Inventors: François Roy, Seyssins (FR); Pierrick Descure, Saint-Ismier (FR)

(73) Assignees: STMicroelectronics (Grenoble) SAS, Grenoble (FR); STMicroelectronics (Crolles 2) SAS, Crolles (FR)

( * ) Notice: Subject to any disclaimer, the term of this patent is extended or adjusted under 35 U.S.C. 154(b) by 400 days.

(21) Appl. No.: 12/697,964

(22) Filed: Feb. 1, 2010

(65) Prior Publication Data
US 2010/0193845 A1 Aug. 5, 2010

(30) Foreign Application Priority Data

Feb. 5, 2009 (FR) ...................................... 09 50723

(51) Int. Cl.
*H01L 31/102* (2006.01)
(52) U.S. Cl.
USPC ........... 257/452; 257/229; 257/294; 257/436; 257/E31.04; 257/E31.124
(58) Field of Classification Search
USPC ................. 257/222, 228, 229, 290, 291, 292, 257/294, 431, 432, 434, 436, 443, 446, 447, 257/452, 459, 460, 461, 462, 463, E31.001, 257/E31.04, E31.124; 348/294
See application file for complete search history.

(56) References Cited

U.S. PATENT DOCUMENTS

| 4,377,817 | A | 3/1983 | Nishizawa et al. |
| 2006/0289911 | A1 | 12/2006 | Lee et al. |
| 2007/0029590 | A1* | 2/2007 | Rhodes et al. ................ 257/291 |
| 2007/0052056 | A1 | 3/2007 | Doi et al. |
| 2007/0272958 | A1 | 11/2007 | Misaki et al. |
| 2008/0083940 | A1 | 4/2008 | Ezaki et al. |
| 2008/0173963 | A1* | 7/2008 | Hsu et al. ...................... 257/431 |
| 2008/0290382 | A1 | 11/2008 | Hirota |
| 2009/0184317 | A1* | 7/2009 | Sanfilippo et al. .............. 257/49 |
| 2010/0127314 | A1* | 5/2010 | Frach ............................ 257/292 |

FOREIGN PATENT DOCUMENTS

JP 2005353994 12/2005

OTHER PUBLICATIONS

French Search Report dated Sep. 18, 2009 from corresponding French Application No. 09/50723 filed Feb. 5, 2009.

* cited by examiner

*Primary Examiner* — Eduardo A Rodela
(74) *Attorney, Agent, or Firm* — Wolf, Greenfield & Sacks, P.C.

(57) ABSTRACT

A backside illumination semiconductor image sensor, wherein each photodetection cell includes a semiconductor body of a first conductivity type of a first doping level delimited by an insulation wall, electron-hole pairs being capable in said body after a backside illumination; on the front surface side of said body, a ring-shaped well of the second conductivity type, this well delimiting a substantially central region having its upper portion of the first conductivity type of a second doping level greater than the first doping level; and means for controlling the transfer of charge carriers from said body to said upper portion.

21 Claims, 5 Drawing Sheets

BACKSIDE ILLUMINATION SEMICONDUCTOR IMAGE SENSOR

CROSS REFERENCE TO RELATED APPLICATIONS

This application claims the priority benefit of French patent application number 09/50723, filed on Feb. 5, 2009, entitled "BACKSIDE ILLUMINATION SEMICONDUCTOR IMAGE SENSOR," which is hereby incorporated by reference to the maximum extent allowable by law.

BACKGROUND OF THE INVENTION

1. Field of the Invention

The present invention relates to a backside illumination semiconductor image sensor.

2. Discussion of the Related Art

FIG. 1 schematically illustrates the circuit of a photosensitive cell of an array of photosensitive cells of an image sensor. A charge transfer transistor TR, a precharge device, and a read device are associated with each photosensitive cell of the array. The precharge device is formed of an N-channel MOS transistor RST, interposed between a supply rail Vdd and a read node S. The read device is formed of the series connection of first and second N-channel MOS transistors SF and RD. The drain of transistor SF is connected to supply rail Vdd. The source of transistor RD is connected to an input terminal P of a processing circuit (not shown). The gate of read transistor SF, assembled as a source follower, is connected to read node S. The photosensitive cell comprises a photodiode D having its anode connected to reference supply rail GND and its cathode connected to node S via charge transfer transistor TR. Generally, the gate control signals of transistors RD, RST, and TR are provided by control circuits, not shown in FIG. 1, and may be provided to all the photosensitive cells of a same row of the cell array. It should be noted that a photodiode is always associated with a transfer transistor TR, but that there may exist a single precharge device and a single read device for a group of photodiodes, the drains of the transfer transistors of these photodiodes being then interconnected to a same node S.

Read nodes of the photosensitive cell of FIG. 1 are well known and an example taken hereafter will be found in U.S. Pat. No. 7,067,792 (B5666).

FIG. 2 shows an example of a timing diagram of signals RD, RST, TR applied to the gates of the transistors of same reference and of voltage $V_S$ at node S of the circuit of FIG. 1 for a read cycle. Signals RD, RST, and TR are binary signals varying between high and low levels which may be different for each of the signals.

Between two read cycles of the photosensitive cell, signal TR is at the low level and the transfer transistor is off. An illumination causes the forming and the storage of charges at the level of photodiode D. Further, signal RST is in a high state. The precharge transistor is thus on. Voltage $V_S$ is then substantially equal to voltage Vdd.

At a time $t_0$, the array row containing the photosensitive cell to be read is selected by setting signal RD to the high level. The precharge of read node S is interrupted by setting signal RST to the low state at a time t1, thus turning off the precharge transistor. Voltage $V_S$ at read node S is then set to a precharge level $V_{RST}$ which may be lower than voltage Vdd due to a coupling with precharge transistor RST. Precharge level $V_{RST}$ is generally disturbed by noise essentially originating from the thermal noise of the channel of the precharge transistor. This noise is sampled and maintained on the capacitance of node S during the off state of the precharge transistor. Precharge level $V_{RST}$ is then stored outside of the photosensitive cell by the read circuit.

At a time $t_2$, signal TR is set to the high state. The transfer transistor is then on, which enables to transfer the charges stored in photodiode D towards read node S. Voltage $V_S$ then decreases down to a useful signal level $V_{RD}$. Once the charge transfer has been performed, signal TR is set to a low level at a time $t_3$, thus enabling to insulate photodiode D again and to start a new charge generation and storage cycle resulting from the illumination. The level of useful signal $V_{RD}$ is then read by the read circuit. Like precharge level $V_{RST}$, useful signal level $V_{RD}$ is especially disturbed by the thermal noise of the precharge transistor which has been sampled and maintained on the capacitance of node S. The subtraction of signals $V_{RD}$ and $V_{RST}$ by the processing circuit enables eliminating the noise by double correlated sampling. Once the reading is over, signal RST is set to the high state at a time $t_4$ to precharge read node S again. Finally, at a time $t_5$, signal RD is set to the low state to deselect the photosensitive cell.

FIG. 3 illustrates, in partial simplified cross-section view, a monolithic embodiment of the assembly of diode D and of transfer transistor TR of FIG. 1. These elements are formed in the same active area of a semiconductor substrate 1 of a first conductivity type, for example, type P, lightly doped (P⁻). This substrate for example corresponds to an epitaxial layer on a silicon wafer which forms reference supply rail GND. The active area is delimited by field insulation areas 2, for example, made of silicon oxide (SiO₂), and corresponds to a well 3 of the same conductivity type as underlying substrate 1, but more heavily doped. An insulated gate structure 4 that may be provided with lateral spacers is formed above the surface of well 3. Source and drain regions 5 and 6 of the opposite conductivity type, for example, N, are located on either side of gate 4, at the surface of well 3. Drain region 6, to the right of gate 4, is heavily doped (N⁺). Source region 5 is made on a much greater surface than drain region 6 and forms with underlying well 3 the junction of photodiode D. Gate 4 and drain 6 are solid with metallizations (not shown) which enable to put these regions in contact with transfer control signal TR and with the gate of transistor SF (node S), respectively. The structure is completed by heavily-doped P-type regions 8 and 9 (P⁺). Regions 8 and 9, which underlie areas 2, are connected to the reference voltage or ground via well 3 and substrate 1. Photodiode D is of so-called fully depleted type and comprises, at the surface of its source 5, a shallow P-type region 7, more heavily doped (P⁺) than well 3. Region 7 is in lateral (vertical) contact with region 8. It is thus permanently maintained at the reference voltage level.

An interconnect stack is formed on the upper surface or front surface of the structure. The light reaching the photodiodes arrives on the side of the interconnect stack and needs to cross a succession of insulating layers of this stack while the positions of the metal portions of the stack need to be selected to avoid hindering the light propagation. This poses various problems and backside illumination (BSI) devices have been provided in which the device is thinned down on its rear surface side and used so that the light reaches the photodiodes from this rear surface, that is, from the side opposite to the side on which the interconnect stack is formed. In such BSI devices, it is generally not necessary to associate one microlens with each pixel.

There exist many variations of frontside illumination and backside illumination structures. A common point of many of these structures is, as shown in FIG. 3, that the transfer transistor takes up a given silicon surface area in addition to the surface area taken up by the precharge and read devices. Thus, the useful photoconversion surface area is limited by the surface area necessary to position the transfer transistor and the precharge and read devices. In other words, for a given cell surface area, the surface necessary to place the various transistors associated with the cell needs to be added to the surface area taken up by the photoconversion diode.

Another problem of some prior art devices is the charge collection, that is, the transfer of the charges created in the photoconversion area towards the surface (generally the cathode of a diode) from which these charges need to be transferred.

Another problem of some prior art devices is the existence of non-negligible dark currents.

Another problem of some prior art devices lies in the impossibility of storing a large number of charges in each photoconversion period, which especially causes saturation problems.

SUMMARY OF THE INVENTION

An object of embodiments of the present invention is to provide a device which overcomes one or several disadvantages of prior art devices.

An object of embodiments of the present invention is to provide an image sensor having decreased surface area.

An object of embodiments of the present invention is to provide an image sensor with a low dark current.

An object of embodiments of the present invention is to provide an image sensor which improves the collection of charges generated in the photodetector.

An object of embodiments of the present invention is to provide an image sensor which has a high charge storage level.

According to an embodiment, the present invention provides a backside illumination semiconductor image sensor, wherein each photodetection cell comprises a semiconductor body of a first conductivity type of a first doping level delimited by an insulation wall, electron-hole pairs being capable of forming in said body after a backside illumination; on the front surface side of said body, a ring-shaped well of the second conductivity type, this well delimiting a substantially central region having its upper portion of the first conductivity type of a second doping level greater than the first doping level; and means for controlling the transfer of charge carriers from said body to said upper portion.

According to an embodiment of the present invention, a doped region of the second conductivity type is formed over the entire rear surface of said body.

According to an embodiment of the present invention, the insulation areas are formed of first insulated conductive walls substantially having the depth of said body.

According to an embodiment of the present invention, the insulation areas are formed of doped walls of the second conductivity type substantially having the depth of said body.

According to an embodiment of the present invention, said substantially central region is delimited by a second insulated conductive wall substantially having the depth of said well, said wall being connected to a control terminal.

According to an embodiment of the present invention, the first insulated conductive walls are connected to a bias and control terminal.

According to an embodiment of the present invention, the first conductivity type is type N and the bias and control terminal is provided to be connected to a positive voltage during a photoconversion phase and to a negative or zero voltage during a transfer phase.

According to an embodiment of the present invention, the first conductivity type is type N and the control terminal is provided to be connected to a negative voltage during a photoconversion phase and to a positive or zero voltage during a transfer phase.

According to an embodiment of the present invention, the first conductivity type is type N and the control terminal is capable of being connected to a low-level voltage during a photoconversion phase and to a high-level voltage during a transfer phase.

The foregoing objects, features, and advantages of the present invention will be discussed in detail in the following non-limiting description of specific embodiments in connection with the accompanying drawings.

DETAILED DESCRIPTION

Figure 1:
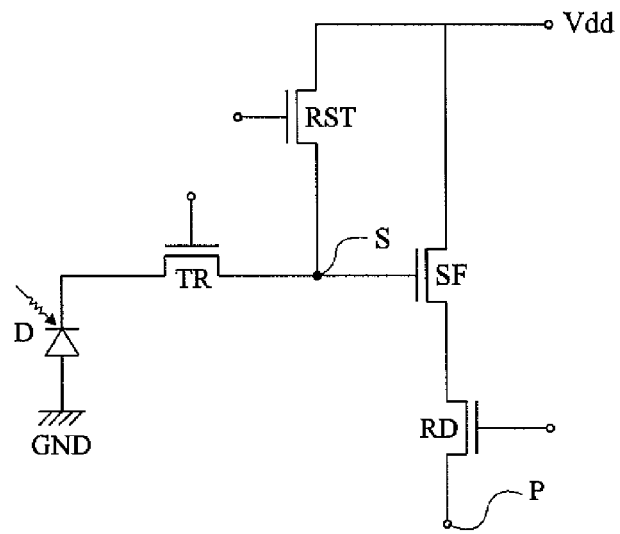
FIG. 1, previously described, shows an electric diagram of a photosensitive cell.
Figure 4:
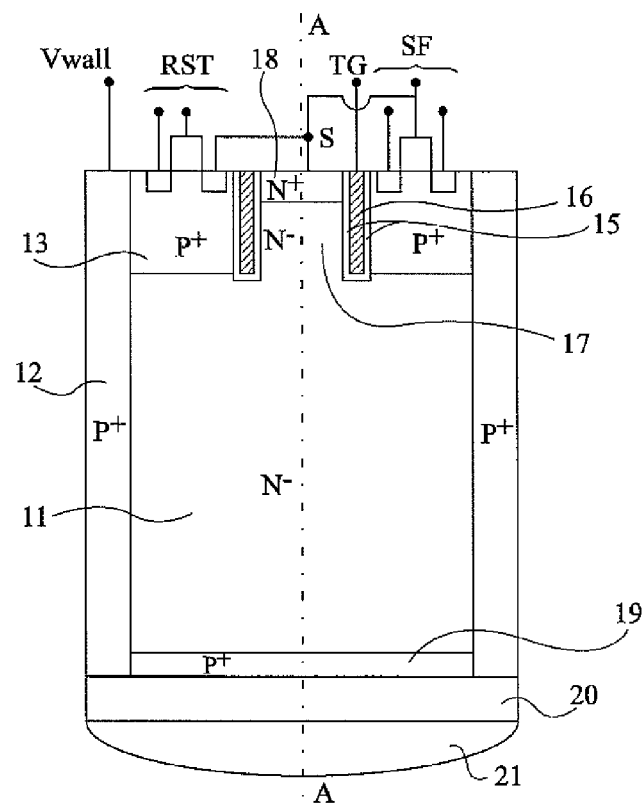
FIG. 4 is a cross-section view of a first embodiment of an image sensor according to the present invention.

FIG. 4 is a cross-section view of an embodiment of a cell of an image sensor. This cell is manufactured from a portion of a lightly-doped N-type silicon layer or body 11, for example with a doping level on the order of from $10^{14}$ to $10^{16}$ atoms/cm$^3$. This layer has a thickness smaller than 10 µm, preferably on the order of from 3 to 5 µm. It is a backside illumination device, that is, layer 11 will initially have formed the upper surface of a thick silicon substrate, possibly the upper silicon layer of a structure of silicon on insulator type (SOI). A heavily-doped P-type wall 12 surrounds the cell and separates it from the neighboring cells. A ring-shaped well 13 is formed on the front surface side of the cell and defines a substantially central N-type portion surrounded with an insulated trench (insulator 15) filled with a conductive material 16 connected to a terminal TG. The central portion comprises a lower lightly-doped N-type portion 17 and an upper heavily-doped N-type portion 18. Various transistors are formed in well 13, for example, transistors RST and SF of FIG. 1 (transistor RD is not shown). The precharge and read transistors may be common to several neighboring cells, presently to a group of four cells. Various metallization levels are formed on the upper surface, to ensure the connections to the drains, sources, and gates of the various transistors. In particular, an interconnect corresponding to read node S of FIG. 1 is provided between N$^+$ region 18, the drain of precharge transistor RST, and the gate of the follower transistor. Conventionally, once these various layers and connections have been formed, a silicon wafer forming a handle is glued on the upper surface of the metallization stack and the device is thinned down on the rear surface side to have the shown structure.

After this, a thin layer 19 of the second conductivity type is formed over the entire rear surface (this layer may be formed at another manufacturing stage, for example, initially in the case of an SOI substrate). Layer 19 has a function of inversion of the type of majority carriers contained in body 11. This inversion of the concentration of the type of carriers might also be performed by a MOS capacitance at the rear surface provided with an electrode (metallic, semiconductor, or dielectric), transparent in the useful sensor sensitivity spectrum, which creates a free carrier inversion channel (MOS effect).

Finally, the lower surface of each cell is covered with a filter 20 having the desired color for the considered cell, for example, red, green, or blue. Although this is optional in this type of structure, a lens 21 may cover filter 20. As indicated previously, the semiconductor structure may have a thickness on the order of from 3 to 10 micrometers. Further, the lateral extension of each cell may be smaller than one micrometer.

Figure 5:
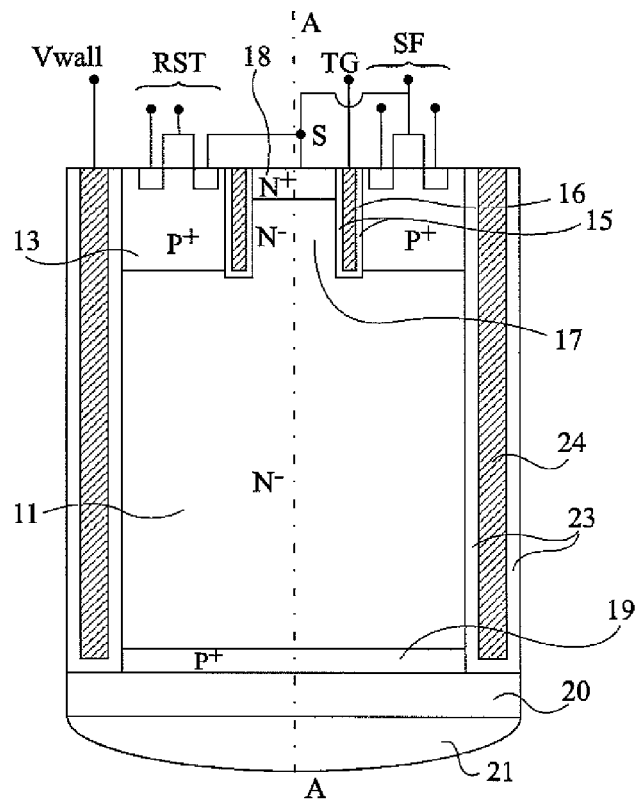
FIG. 5 is a cross-section view of a second embodiment of an image sensor according to the present invention.

FIG. 5 is a cross-section view of a second embodiment of an image sensor cell. In FIG. 5, the same elements are designated with the same reference numerals as in FIG. 4. The main difference between the cells of FIGS. 5 and 4 is that the insulating wall surrounding the cell is formed of a trench filled with a conductor 24 surrounded with an insulator 23 instead of being a P-type region. Conductor 24 is connected to a terminal $V_{wall}$.

The cells of FIGS. 4 and 5 operate similarly. In both cases, a phase of photoconversion or integration during which the rear surfaces are illuminated and electrons are stored in body 11 is distinguished from a transfer phase during which the electrons are transferred from body 11 to layer 18 and to read node S.

Figure 3:
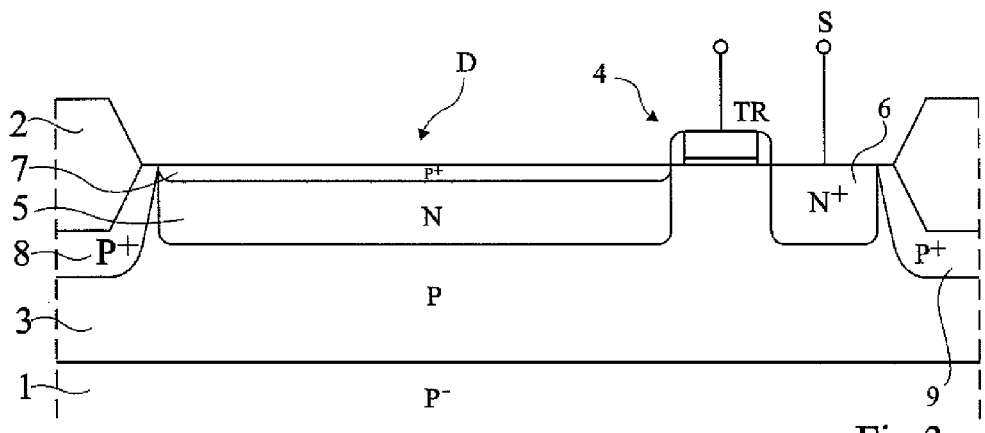
FIG. 3, previously described, is a partial simplified cross-section view of a portion of the circuit of FIG. 1 made in monolithic form.

During the integration phase, the conduction between semiconductor body 11 and heavily-doped N-type region 18 is interrupted by an action on control terminal TG coupled to insulated conductive region 16. Indeed, if electrode TG is set to a negative voltage, for example, −1 volt, region 17 is fully depleted from electrons and the passing of the charge carriers is inhibited by the potential barrier thus created between region 17 and body area 11. Thus, region 17 plays the same role as the channel region of transistor TR of FIGS. 1 and 3 and region 18 corresponds to the drain region of this transistor connected to read node S.

Figure 6A:
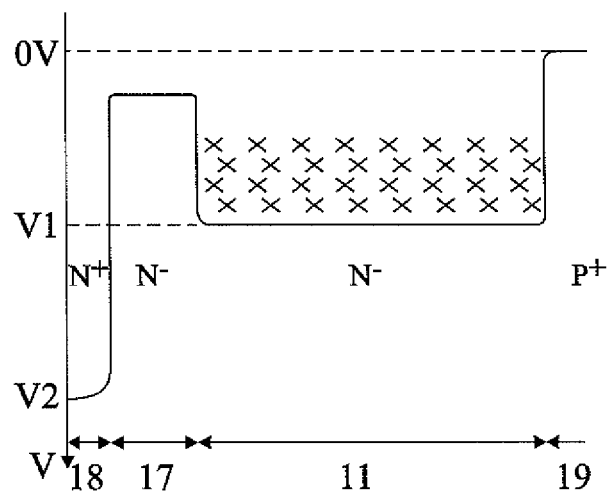
FIGS. 6A and 6B illustrate the electrostatic voltage distribution along a line A-A for two states of the devices of FIGS. 4 and 5.
Figure 6B:
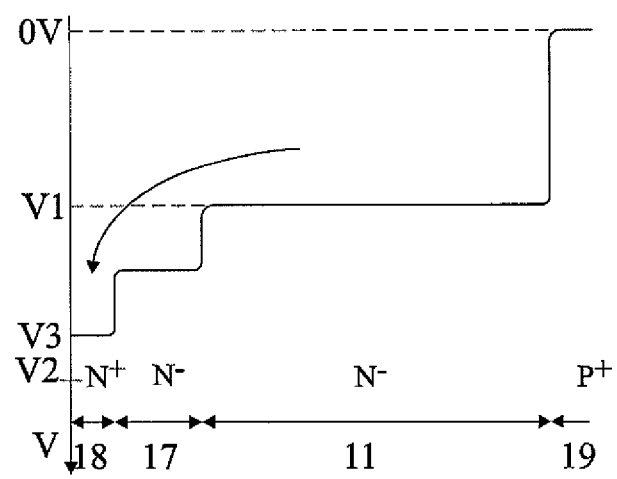

FIGS. 6A and 6B show the distribution of the electrostatic voltages taken along line A-A of FIGS. 4 and 5, respectively during an integration phase and during a transfer phase.

Figure 2:
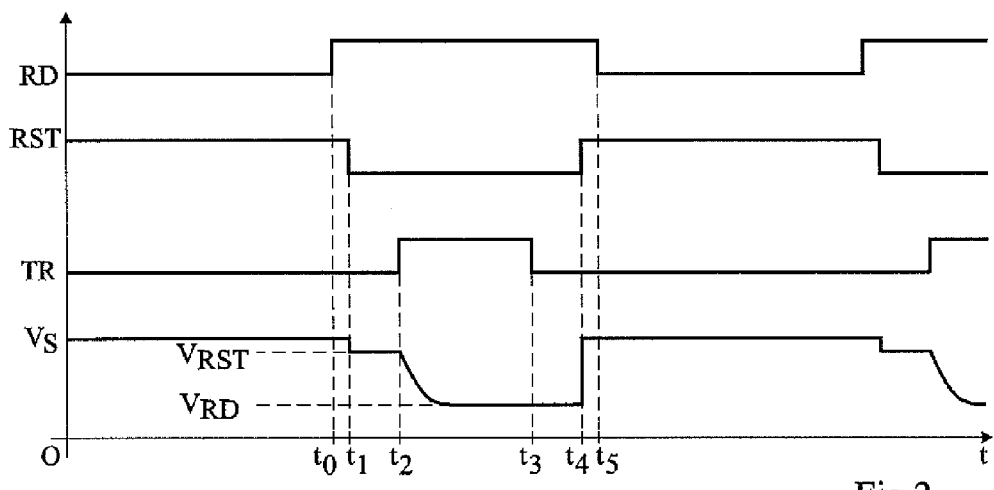
FIG. 2, previously described, illustrates a timing diagram of voltages characteristic of the circuit of FIG. 1.

As shown in FIG. 6A, during an integration phase, body 11 corresponds to a potential well having its maximum positive voltage V1 progressively decreasing while electrons (represented by crosses) accumulate in this body. Along a cross-section, not shown, in a plane perpendicular to axis A-A, the electrostatic voltage of body area 11 is maximum at the intersection with axis A-A and decreases as the distance from this intersection towards insulating wall 23 of the insulating wall (FIG. 5) or towards P+ wall 12 (FIG. 4) which is at the reference electrostatic voltage of well 13 increases. The voltage on electrode 16 is such that central region 17 is fully depleted and that its maximum electrostatic voltage is smaller than the maximum voltage of body 11 without the charge storage. As long as the electrostatic voltage of body 11 remains greater than that of region 17, the electrons cannot transit towards region 18 with a high N+ doping level, region 18 being at a strongly positive electrostatic voltage V2, close to Vdd (see FIG. 2). If, due to the accumulation of electrons, the electrostatic voltage in the body reaches the voltage of region 17, the excess electrons may transit towards region 18 and are carried off in the drain area. This forms an anti-blooming protection. During this integration phase, in the embodiments of FIGS. 4 and 5, the peripheral wall is set to a zero or slightly negative voltage $V_{wall}$ to eliminate the holes. In the case of FIG. 4, if P+ wall 12 is at the ground voltage, the holes created in body 11 will cross the N−/P+ junction and will be sent to ground connection $V_{wall}$. In the case of FIG. 5, voltage $V_{wall}$ is preferably slightly negative, for example, −1 volt. Then, the holes will cover the wall and an upward hole circulation will be established, towards the P+ well which generally is at the ground voltage.

As shown in FIG. 6B, during a transfer phase, a positive voltage is applied to terminal TG. Thus, the depletion of N− region 17 stops and the electrons accumulated in this region during the integration phase are attracted towards the N+ region which is at a higher electrostatic voltage than body 11. Due to the arrival of these electrons, voltage $V_S$ of read node S decreases from V2 to V3 and this voltage variation is measured by the read and processing circuits.

The implementation of the above steps ensures a very good electron transfer from semiconductor body 11 to region 18 corresponding to node S. Given that there is virtually no lost space for body 11 in which a photoconversion phenomenon occurs, significant charge levels may be accumulated. Further, the way in which the periphery of body 11 where the photoconversion occurs is formed results in extremely low dark currents. Indeed, this periphery is either totally surrounded with P+ regions in the case of FIG. 4, or partially surrounded with a P+ region and partially surrounded with a capacitive hole storage structure in the case of FIG. 5. Finally and obviously, the device according to the present invention enables using virtually the entire available surface area (except the surface taken up by the insulating walls) for the photoconversion.

As a summary and as an image, in the case of FIGS. 4 and 5, it can be considered that, during the integration phase, one is in the presence of a bottle having its body 11 progressively filling with electrons while its neck 17 is closed and, during the transfer phase, the neck is opened and the bottle is turned over to drive the electrons towards outlet 18 of the bottle.

Figure 7:
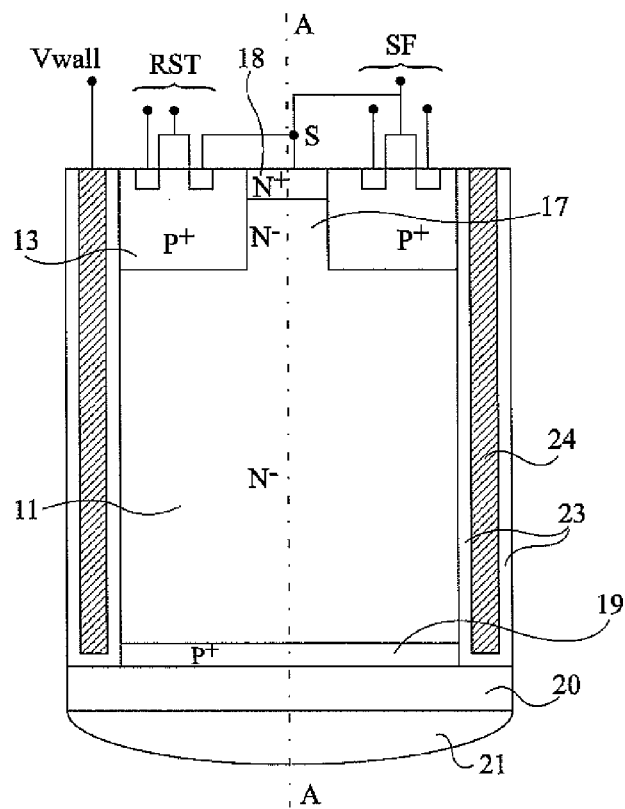
FIG. 7 is a cross-section view of a third embodiment of an image sensor according to the present invention.
Figure 8:
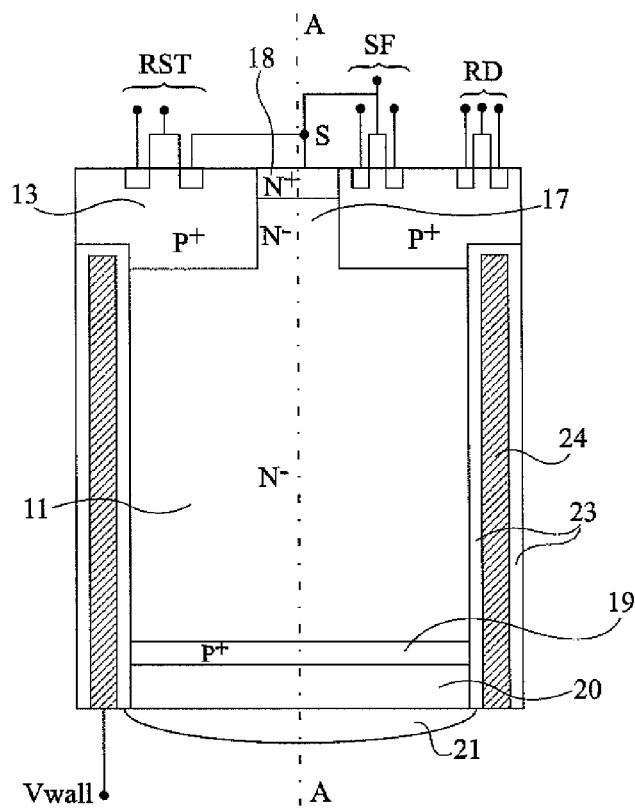
FIG. 8 is a cross-section view illustrating a variation of the third embodiment of an image sensor according to the present invention.

FIGS. 7 and 8 show two variations of a third embodiment. The embodiment of FIG. 7 is similar to that of FIG. 5 and the same elements have been designated with the same reference numerals. The main difference is that in the embodiment of FIG. 7, grid 15-16 for closing the neck is absent. In this embodiment, during the integration phase, terminal $V_{wall}$ is set to a strongly positive voltage to create a potential well in body region 11 and thus store the electrons within insulating walls 23. In a plane perpendicular to axis A-A, the electrostatic voltage of body region 11 is maximum along axis A-A and minimum at the level of insulating walls 23. The electrostatic voltage of P+ layer 19 is controlled by the amount of holes stored in this area. For a voltage of layer 19 smaller than the voltage at the level of walls 23, it is possible to store holes. This lack of holes will be compensated by addition of holes originating from the photocurrents. For a layer voltage 19 which tends to be greater than the voltage at the wall level, there is an excess of holes which will be immediately carried off towards P+ well 13 via the electrostatic channel at the level of walls 23. The voltage at the level of walls 23 varying between the integration mode and the charge transfer mode, the voltage of P+ layer 19 will adjust according to the cycle and to the illumination level. Terminal $V_{wall}$ is set to a zero or slightly negative value when the electron transfer towards N+ region 18 is desired to be performed and the electrons are then pushed back through the neck towards N+ region 18.

FIG. 8 shows a variation of the embodiment of FIG. 7. This time, the lateral wall surrounding semiconductor body 11 is dug from the rear surface of the structure and not as previously from the front surface. This embodiment requires different manufacturing steps but the obtained result is similar. The advantage is that the P+ wells can take up a large surface area, given that they also extend above the insulating wall. To better illustrate this well surface increase, a transistor RD arranged laterally next to transistor SF has been shown in FIG. 8.

Figure 9A:
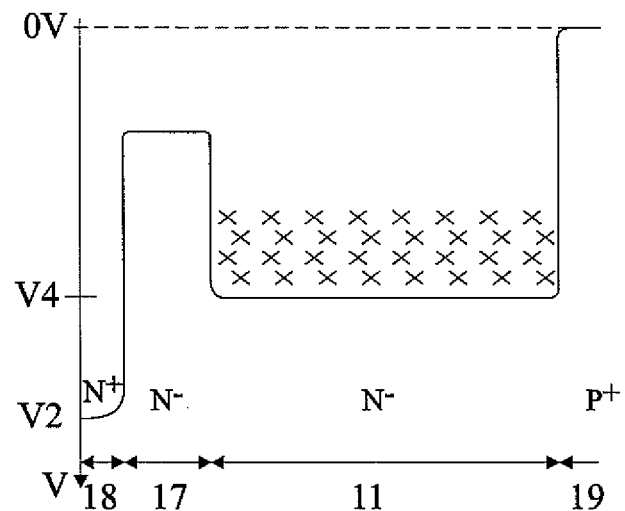
FIGS. 9A and 9B illustrate the electrostatic voltage distribution along a line A-A for two states of the devices of FIGS. 7 and 8.
Figure 9B:
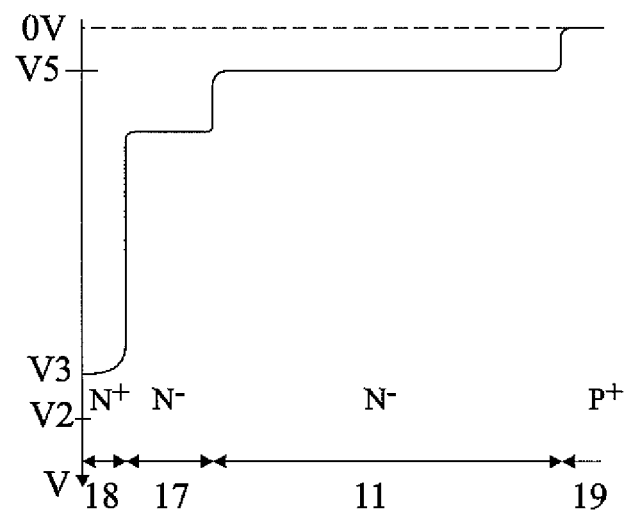

FIGS. 9A and 9B show the distribution of the electrostatic voltages along line A-A of FIGS. 7 and 8, respectively during an integration phase and during a transfer phase.

As shown in FIG. 9A, during an integration phase, the voltage of body 11 is a high electrostatic voltage (V4) due to the electrostatic coupling with the high voltage of the peripheral insulated conductive wall. This voltage is higher than that of central region 17 (at 0 V or at a slightly positive voltage) and region 18 is at a higher voltage still. Thus, electrons (represented by crosses) stored in body 11 cannot transit towards region 18 due to the potential barrier formed by region 17, except if the voltage of area 11 comes close to the voltage value of area 17. In this case, the excess electrons are carried off towards N+ drain region 18 (antiblooming).

As shown in FIG. 9B, during a transfer phase, the maximum voltage of body 11 is brought, by electrostatic coupling with the insulated coupler of the insulating wall, down to a low value (V5), lower than that of region 17. Thus, the electrons overflow from region 17 to be stored at the level of the read node, and thus decrease its voltage from V2 to V3.

Using the previous image, in this embodiment, during the bottle filling phase, although the neck is open, the electrons are maintained against the bottle walls by electrostatic attraction. At the time when a transfer is desired to be performed, the bottle is turned over and it is pressed against the walls so that the electrons are pushed back through the neck towards outlet 18 of the bottle.

The image capture device for example belongs to a mobile phone, to a digital camera, to a portable game console or to another device comprising a digital device.

It should be clear for those skilled in the art that the various features described hereabove in relation with the different embodiments and with the state of the art may be combined in any combination. Further, an embodiment in which a signal corresponding to electrons is detected, stored, and transferred. It will be within the abilities of those skilled in the art to form a similar system in which the charges are holes, by inverting all conductivity types and by adapting the implementation voltages.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A backside illumination semiconductor image sensor, wherein each photodetection cell comprises:

a semiconductor body of a first conductivity type of a first doping level delimited by an insulation wall, electron-hole pairs being capable of forming in said body after a backside illumination;

on a front surface side of said body, a ring-shaped well of a second conductivity type, the well delimiting a substantially central region having its upper portion of the first conductivity type of a second doping level greater than the first doping level; and means for controlling the transfer of charge carriers, resulting from backside illumination of a rear surface of said body, from said body to said upper portion, wherein said means for controlling includes at least one conductive region that surrounds said central region or said body, wherein the means for controlling is configured to control transfer of the charge carriers from said body to said upper portion in a transfer phase and to hold the charge carriers in said body in a photoconversion phase, and wherein the means for controlling is configured to control an electrostatic voltage in said central region relative to an electrostatic voltage in said body.

2. The image sensor of claim 1, wherein a doped region of the second conductivity type is formed over the entire rear surface of said body.

3. The image sensor of claim 1, wherein the insulation wall is formed of first insulated conductive walls substantially having the depth of said body.

4. The image sensor of claim 3, wherein the first insulated conductive walls are connected to a bias and control terminal.

5. The image sensor of claim 4, wherein the first conductivity type is type N and the bias and control terminal is provided to be connected to a positive voltage during the photoconversion phase and to a negative or zero voltage during the transfer phase.

6. The image sensor of claim 1, wherein the insulation wall is formed of doped walls of the second conductivity type substantially having the depth of said body.

7. The image sensor of claim 1, wherein the first conductivity type is type N and the means for controlling includes a control terminal configured to be connected to a low-level voltage during the photoconversion phase and to a high-level voltage during the transfer phase.

8. A backside illumination semiconductor image sensor, wherein each photodetection cell comprises:

a semiconductor body of a first conductivity type of a first doping level delimited by an insulation wall, electron-hole pairs being capable of forming in said body after a backside illumination;

on a front surface side of said body, a ring-shaped well of a second conductivity type, this well delimiting a substantially central region having its upper portion of the first conductivity type of a second doping level greater than the first doping level; and means for controlling the transfer of charge carriers from said body to said upper portion, wherein said substantially central region is delimited by a second insulated conductive wall substantially having the depth of said well, said second insulated conductive wall being connected to a control terminal.

9. The image sensor of claim 8, wherein the first conductivity type is type N and the control terminal is provided to be connected to a negative voltage during a photoconversion phase and to a positive or zero voltage during a transfer phase.

10. A backside illumination image sensor having an array of photodetector cells, each photodetector cell comprising:

a semiconductor body of a first conductivity type and a first doping level, the semiconductor body having a front surface and a rear surface and being delimited by an insulating wall, charge carriers forming in the body in response to backside illumination of the rear surface of the body;

a ring-shaped well of a second conductivity type on the front surface of the body, the ring-shaped well defining a central neck region;

a read node, in an upper portion of the neck region, of a second conductivity type and a second doping level greater than the first doping level; and at least one conductive region configured to control transfer of the charge carriers, resulting from the backside illumination, from the body to the read node in a transfer phase and to hold the charge carriers in the body in a photoconversion phase.

11. A backside illumination image sensor as defined in claim 10, wherein the at least one conductive region surrounds the neck region and is configured to control an electrostatic voltage in the neck region relative to an electrostatic voltage in the body.

12. A backside illumination image sensor as defined in claim 10, wherein the at least one conductive region surrounds the body and is configured to control an electrostatic voltage in the body relative to an electrostatic voltage in the neck region.

13. A backside illumination image sensor as defined in claim 10, further comprising a doped region of the second conductivity type over the rear surface of the body.

14. A backside illumination image sensor as defined in claim 10, wherein the insulating wall comprises a first insulating conductive wall.

15. A backside illumination image sensor as defined in claim 14, wherein the first insulating conductive wall is connected to a bias and control terminal and wherein the first conductivity type is N-type and the bias and control terminal is configured for connection to a positive voltage during the photoconversion phase and to a negative or zero voltage during the transfer phase.

16. A backside illumination image sensor as defined in claim 10, wherein the insulating wall comprises a doped wall of the second conductivity type.

17. A backside illumination image sensor as defined in claim 10, wherein the neck region is delimited by an insulated conductive wall, the insulated conductive wall being connected to a control terminal.

18. A backside illumination image sensor as defined in claim 17, wherein the first conductivity type is N-type and the control terminal is configured for connection to a negative voltage during the photoconversion phase and to a positive or zero voltage during the transfer phase.

19. A backside illumination image sensor as defined in claim 10, wherein the first conductivity type is N-type and the at least one conductive region is configured for connection to a low level voltage during the photoconversion phase and to a high level during the transfer phase.

20. A backside illumination image sensor as defined in claim 10, further comprising at least one transistor formed in the ring-shaped well.

21. A backside illumination semiconductor image sensor, wherein each photodetection cell comprises:

a semiconductor body of a first conductivity type of a first doping level delimited by an insulation wall, electron-hole pairs being capable of forming in said body after a backside illumination;

on a front surface side of said body, a ring-shaped well of a second conductivity type, the well delimiting a substantially central region having its upper portion of the first conductivity type of a second doping level greater than the first doping level; and means for controlling the transfer of charge carriers, resulting from backside illumination of a rear surface of said body, from said body to said upper portion, wherein said means for controlling includes at least one conductive region that surrounds said central region or said body, wherein the means for controlling is configured to control transfer of the charge carriers from said body to said upper portion in a transfer phase and to hold the charge carriers in said body in a photoconversion phase, and wherein the means for controlling is configured to control an electrostatic voltage in said body relative to an electrostatic voltage in said central region.

* * * * *